(12) United States Patent
Nakatani (10) Patent No.: US 8,829,509 B2
(45) Date of Patent: Sep. 9, 2014

(54) ORGANIC EL DISPLAY PANEL AND METHOD FOR MANUFACTURING SAME

(75) Inventor: Shuhei Nakatani, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/881,725

(22) PCT Filed: Apr. 9, 2012

(86) PCT No.: PCT/JP2012/002459
§ 371 (c)(1),
(2), (4) Date: Apr. 26, 2013

(87) PCT Pub. No.: WO2012/144156
PCT Pub. Date: Oct. 26, 2012

(65) Prior Publication Data
US 2013/0234126 A1    Sep. 12, 2013

(30) Foreign Application Priority Data
Apr. 22, 2011    (JP) .................................. 2011-095748

(51) Int. Cl.
*H01L 51/00* (2006.01)
*H01L 51/52* (2006.01)
*H01L 27/32* (2006.01)
*H01L 51/56* (2006.01)
*H05B 33/10* (2006.01)

(52) U.S. Cl.
CPC ........ *H01L 51/5203* (2013.01); *H01L 27/3283* (2013.01); *H01L 51/56* (2013.01); *H05B 33/10* (2013.01); *H01L 27/3246* (2013.01)
USPC .................... 257/40; 257/59; 257/72; 438/99

(58) Field of Classification Search
CPC . H01L 27/32; H01L 27/3246; H01L 27/3283; H01L 51/5253
USPC ................... 257/40, 59, 72; 438/99
See application file for complete search history.

(56) References Cited

U.S. PATENT DOCUMENTS

| 8,502,443 B2 * | 8/2013 | Yang ............................ 313/504 |
| 2004/0201048 A1 | 10/2004 | Seki et al. |

(Continued)

FOREIGN PATENT DOCUMENTS

| EP | 0 989 783 | 3/2000 |
| JP | 63-64291 | 3/1988 |

(Continued)

OTHER PUBLICATIONS

The Extended European Search Report dated Jul. 12, 2013 for the corresponding EP Application No. 12774563.6.

(Continued)

*Primary Examiner* — Tu-Tu Ho
(74) *Attorney, Agent, or Firm* — Panasonic Patent Center (57) ABSTRACT

The present invention provides an organic EL display panel such that, even when a light emitting layer is formed in a line bank, generation of brightness unevenness and emission color unevenness due to application unevenness of an organic light emitting layer is suppressed, and good display quality is achieved. In the present invention, an insulation layer, which would cause application unevenness of the organic light emitting layer, is formed on the organic light emitting layer so as to cover an edge of a pixel electrode. It is possible to suppress film-shape unevenness of the organic light emitting layer, whereby provision and manufacture of an organic EL display panel which exhibits excellent display quality with reduced brightness unevenness and emission color unevenness become possible.

10 Claims, 7 Drawing Sheets

(56) References Cited

U.S. PATENT DOCUMENTS

| | | | |
|---|---|---|---|
| 2005/0112341 A1 | 5/2005 | Ito et al. | |
| 2005/0170076 A1 | 8/2005 | Seki et al. | |
| 2005/0170550 A1 | 8/2005 | Seki et al. | |
| 2005/0186403 A1 | 8/2005 | Seki et al. | |
| 2007/0075618 A1 | 4/2007 | Mitsuya | |
| 2009/0008667 A1 | 1/2009 | Fujii et al. | |
| 2009/0020751 A1 | 1/2009 | Seki et al. | |
| 2009/0140638 A1 | 6/2009 | Asano | |
| 2009/0160322 A1 | 6/2009 | Yoshida et al. | |
| 2009/0243483 A1 | 10/2009 | Yang | |
| 2009/0284146 A1 * | 11/2009 | Yoshida et al. | 313/504 |

FOREIGN PATENT DOCUMENTS

| | | |
|---|---|---|
| JP | 10-172761 | 6/1998 |
| JP | 2001-210469 | 8/2001 |
| JP | 2004-234901 | 8/2004 |
| JP | 2006-86128 | 3/2006 |
| JP | 2006-243171 | 9/2006 |
| JP | 2008-243650 | 10/2008 |
| JP | 2008-305580 | 12/2008 |
| JP | 2009-70704 | 4/2009 |
| JP | 2009-200049 | 9/2009 |
| JP | 2010-33972 | 2/2010 |
| JP | 2011-38090 | 2/2011 |
| WO | 2009/087966 | 7/2009 |

OTHER PUBLICATIONS

International Search Report of PCT Application No. PCT/JP2012/002459 dated Jun. 26, 2012.

* cited by examiner

| | EXAMPLE | COMPARATIVE EXAMPLE |
|---|---|---|
| FILM PROFILE | COATING AREA | COATING AREA |
| THICKNESS UNIFORMITY | 14.8% | 33.4% |

ORGANIC EL DISPLAY PANEL AND METHOD FOR MANUFACTURING SAME

CROSS-REFERENCE TO RELATED APPLICATIONS

The present application is a national phase application of international application PCT/JP2012/002459 filed on Apr. 9, 2012, which claims the benefit of foreign priority to Japanese patent application 2011-095748 filed on Apr. 22, 2011, the contents of which are incorporated herein by reference.

TECHNICAL FIELD

The present invention relates to an organic EL display panel and a manufacturing method thereof.

BACKGROUND ART

An organic EL display panel is a display panel having a light-emitting device using electroluminescence of an organic compound. An organic EL display panel has an EL device including a cathode, an anode, and an electroluminescent organic compound layer disposed between both electrodes. The electroluminescent organic compound can be approximately classified into a combination of low-molecular organic compounds (a host material and a dopant material) and a high-molecular organic compound.

Examples of the electroluminescent high-molecular organic compound include poly(p-phenylene vinylene) referred to as PPV or derivatives thereof. An organic EL display panel using the electroluminescent high-molecular organic compound is characterized in that it can be driven with a relatively-low voltage and it has low power consumption.

An electroluminescent organic compound can be dissolved in an organic solvent to form an ink. For example, a high-molecular organic compound can be dissolved in an aromatic organic solvent such as xylene or toluene to produce an ink. By producing an ink containing an electroluminescent organic compound, an organic light-emitting layer can be formed through a printing technique such as an inkjet method. As a result, it is being considered for easily addressing an increase in size of a screen of a display panel and research and studies thereof have been actively carried out.

An electroluminescent high-molecular organic compound is disposed in each pixel through a printing technique such as an inkjet method depending on colors (red, green, and blue) of emitted light. For example, a polymer ink including a high-molecular organic compound and a solvent is ejected from an inkjet head and is printed on each pixel. When a polymer ink is printed in each pixel, the polymer ink should not permeate into neighboring pixels.

The following two methods are employed so as not to cause permeation of the polymer ink into neighboring pixels.

In a first method, a partition wall (bank) defining pixels is provided and the polymer ink is accurately printed on the respective pixels. Accordingly, it is possible to suppress the permeation of the ink into neighboring pixels (for example, see Patent Document 1).

In a second method, pixels are arranged in line regions defined by line banks and the polymer ink is printed in line regions. At this time, the thickness of an organic light-emitting layer may become smaller at edges of pixel electrodes arranged in the line regions defined by line banks, and thus short-circuit between the pixel electrode and a counter electrode which are disposed on the organic light-emitting layer may occur. In this regard, it is known that the short-circuiting between the pixel electrode and the counter electrode can be prevented by disposing an insulating layer of silicon oxide or the like to cover the edges of the pixel electrodes arranged in the line regions defined by the line banks (for example, see Patent Documents 2 and 3).

An organic EL device (for example, see Patent Document 4) in which edges of pixel electrodes are directly covered with an insulating layer on the pixel electrodes, an organic EL device (for example, see Patent Documents 5 to 8) in which edges of pixel electrodes are covered with an insulating inorganic layer such as a bank directly or with a hole injection layer interposed therebetween, and the like have been proposed. In addition, a color filter including a bank partitioning a colorant layer on a transparent substrate and a black matrix covering the bank and edges of the colorant layer is known (for example, see Patent Document 9).

Figure 5:
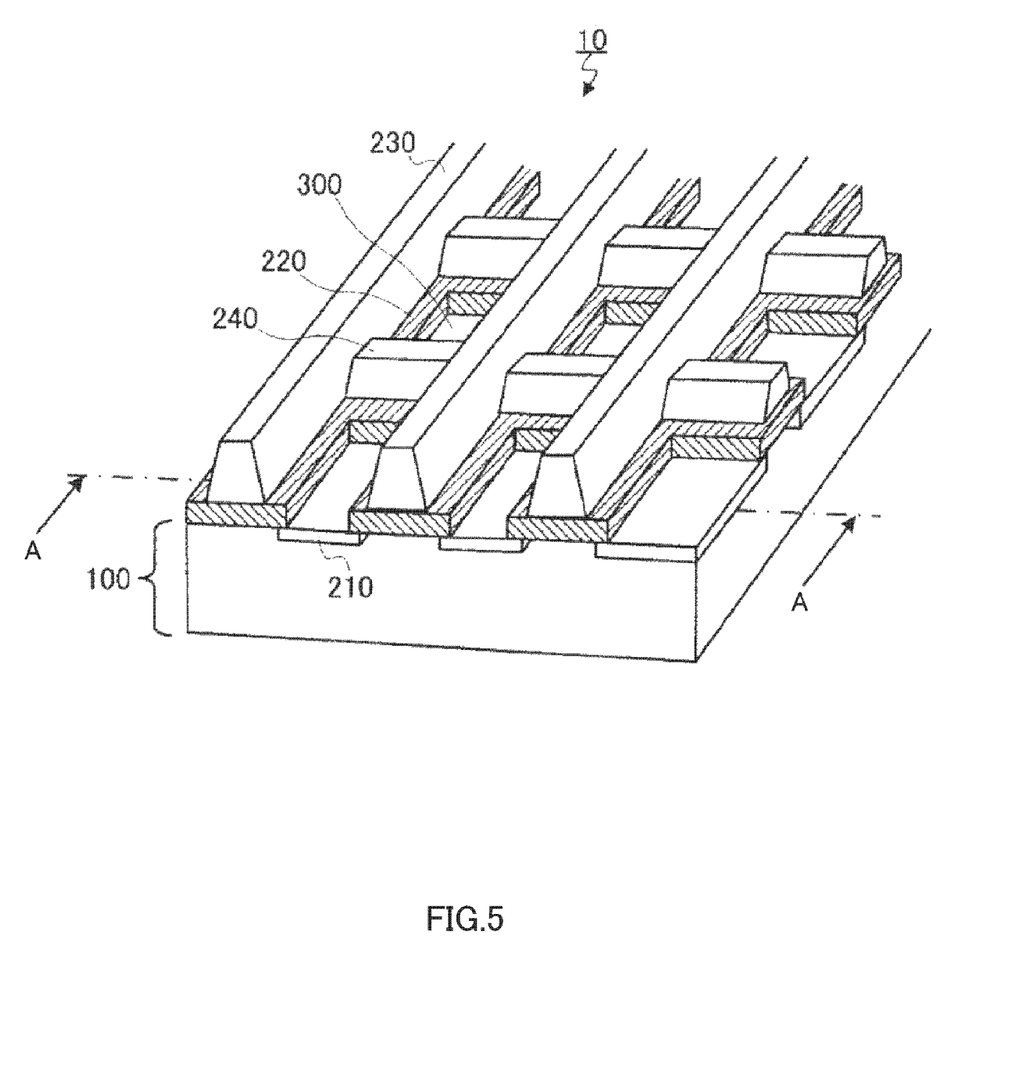
FIG. 5 is an oblique view illustrating an organic EL device according to the related art.

FIG. 5 is an oblique view of an organic EL device 10 described in Patent Document 2. Insulating layer 220 is formed in both a direction parallel to line bank 230 and a direction perpendicular thereto so as to cover the edges of pixel electrodes 210. In FIG. 5, reference numeral 100 represents a substrate, reference numeral 240 represents a second bank, and reference numeral 300 represents a pixel area.

The polymer ink can be more easily and rapidly printed on the pixels through the second method of printing the polymer ink in the line regions where the pixels are arranged, rather than the first method of printing the polymer ink in the respective regions where one pixel is arranged. The uniformity in thickness of the organic light-emitting layer formed on the pixels formed through the second method is superior to that through the first method.

This is because the polymer ink at edges of the banks is attracted by surface tension. Accordingly, the uniformity in thickness of the organic light-emitting layer can deteriorate more easily. Therefore, an organic light-emitting layer having higher uniformity in thickness can be generally formed through the second method in which only two sides of a pixel are surrounded with the banks, rather than the first method in which four sides of a pixel are surrounded with the banks.

When the organic light-emitting layer is formed through an inkjet method, a difference in ejection volume among nozzles of an inkjet head may occur. The difference in ejection volume among the nozzles directly causes a difference in thickness of the organic light-emitting layer. When the ink is ejected in the pixel region or the line region, the ink through more nozzles is ejected in the line region and the ink through less nozzles is ejected in the pixel region. Accordingly, by ejecting ink in the line region, it is possible to reduce the influence on the difference in ejection volume among the nozzles. From this point of view, the second method has recently been studied in some degree.

CITATION LIST

Patent Literature

PTL 1: Japanese Patent Application Laid-Open No. 2006-86128
PTL 2: Japanese Patent Application Laid-Open No. 2009-200049
PTL 3: U.S. Patent Application Laid-Open No. 2009/0160322
PTL 4: Japanese Patent Application Laid-Open No. 2008-243650
PTL 5: Japanese Patent Application Laid-Open No. 2009-70704

PTL 6: U.S. Patent Application Laid-Open No. 2007/0075618

PTL 7: U.S. Patent Application Laid-Open No. 2005/0112341

PTL 8: Japanese Patent Application Laid-Open No. 2010-33972

PTL 9: Japanese Patent Application Laid-Open No. 2006-243171

SUMMARY OF INVENTION

Technical Problem

In the above-mentioned configuration, the insulating layer of silicon oxide or the like disposed to cover the edges of the pixel electrodes arranged in the line region defined by the line banks serves as underlayer for a polymer ink to be applied. Accordingly, the substrate, the pixel electrodes and the insulating layer are present as the underlayer. When the underlayer is constituted by plural types of material, an unevenness in the organic light-emitting layer can occur. This is because wettability of the polymer ink differs depending on the materials of the underlayer. Therefore, it is preferable that the number of types of materials constituting the underlayer be as small as possible.

The insulating layer made of inorganic materials such as silicon oxide can be formed through a sputtering method using vacuum equipment to form an insulating film, and patterning the insulating film through a photolithography method using a photo-resist. This method elongates the manufacturing process and requires high-cost vacuum equipment to be used. Accordingly, the manufacturing cost is raised.

It is preferable that the insulating layer be a thin film with a thickness of several tens of nm. Since the insulating layer has to insulate between electrodes, the thickness greater than or equal to a predetermined value is required. However, when the thickness of the insulating layer is excessively large, the organic light-emitting layer to be printed thereon is not formed uniformly. When the insulating layer is formed of an organic material such as resin or the like instead of the inorganic material, the manufacturing cost is lowered. On the contrary, it is difficult to form the insulating thin film made of the organic material with a thickness of several tens of nm. Accordingly, it is difficult to form a uniform organic light-emitting layer on the insulating layer made of the organic material.

As described above, in the organic EL display panel according to the related art, an unevenness of the organic light-emitting layer formed by printing method can occur due to plural types of inorganic insulating materials constituting the underlayer on which the organic light-emitting layer will be printed. Accordingly, the thickness of the organic light-emitting layer is not uniform and thus a difference in brightness or a difference in light emission occurs, thereby deteriorating display quality.

The invention is made to solve the above-mentioned problems, and provides an organic EL display panel with excellent display quality in which an organic light-emitting layer with excellent uniformity in thickness can be formed and in which has a small difference in brightness or light emission, even when the organic light-emitting layer is formed in the line region defined by line banks in which plural pixel electrodes are arranged. And further, the invention provides a method of manufacturing the organic EL display panel.

Solution to Problem

That is, according to an aspect of the invention, there is provided an organic EL display panel described below.

(1) An organic EL display panel comprising: a plurality of pixel electrodes that are arranged on a substrate; an organic light-emitting layer that is disposed on a region including two or more neighboring pixel electrodes; an insulating layer that is disposed on the organic light-emitting layer and that covers opposing edges of the neighboring pixel electrodes; and a counter electrode that is disposed on the organic light-emitting layer and the insulating layer.

(2) The organic EL display panel according to (1), wherein the organic light-emitting layer covers a region on the substrate including the two or more neighboring pixel electrodes.

(3) The organic EL display panel according to (1) or (2), further comprising a second insulating layer that defines a line region on the substrate in which the plurality of pixel electrodes are arranged in a row.

(4) The organic EL display panel according to (3), wherein the insulating layer is not disposed on the top surface of the second insulating layer.

(5) The organic EL display panel according to any one of (1) to (4), wherein the insulating layer is formed of a cured resin of a delay curing resin composition, which is curable in a predetermined time after ultraviolet rays are applied.

According to another aspect of the invention, there is provided a method of manufacturing an organic EL display panel described below.

That is, according to another aspect of the invention, there is provided a manufacturing method of an organic EL display panel described below.

(6) A method of manufacturing an organic EL display panel, comprising: a step of forming a plurality of pixel electrodes on a substrate; a step of forming an organic light-emitting layer so as to cover a region including two or more neighboring pixel electrodes; a step of forming an insulating layer on the organic light-emitting layer so as to cover opposing edges of the neighboring pixel electrodes; and a step of forming a counter electrode on the organic light-emitting layer and the insulating layer.

(7) The method of manufacturing an organic EL display panel according to (6), wherein the step of forming the organic light-light emitting layer is a step of forming an organic light-emitting layer so as to cover a region on the substrate including the two or more neighboring pixel electrodes.

(8) The method of manufacturing an organic EL display panel according to (6) or (7), further comprising a step of forming a second insulating layer that defines a line region on the substrate in which the plurality of pixel electrodes are arranged in a row, wherein the organic light-emitting layer is formed on a region on the substrate including the two or more neighboring pixel electrodes in the line region defined by the second insulating layer.

(9) The method of manufacturing an organic EL display panel according to any one of (6) to (8), wherein the step of forming the insulating layer includes: irradiating an insulating material containing a delay curing resin composition with ultraviolet rays; applying the insulating material irradiated with the ultraviolet rays on the organic light-emitting layer so as to cover the opposing edges of the neighboring pixel electrodes; and curing the applied insulating material through heat treatment.

Advantageous Effects of Invention

As described above, with the organic EL display panel and the method of manufacturing an organic EL display panel according to the invention, it is possible to prevent the short-circuit between the edges of the pixel electrodes and the counter electrode, even when the organic light-emitting layer is formed by application in the region formed by the line banks. In addition, it is possible to form the organic light-emitting layer uniformly. Accordingly, it is possible to provide an organic EL display panel with excellent display quality, which has a reduced difference in brightness or light emission of the organic EL display panel, at a low cost.

BRIEF DESCRIPTION OF DRAWINGS

FIGS. 1(A) to (C) are diagrams illustrating an organic EL device according to Embodiment 1, where

FIGS. 2(A) to (B) are diagrams illustrating an organic EL device according to Embodiment 2, where

FIGS. 4(A) to (B) are diagrams illustrating an organic EL device according to Embodiment 4, where

DESCRIPTION OF EMBODIMENTS

1. Organic EL Display Panel

An organic EL display panel according to the invention may include one, or two or more organic EL devices.

The organic EL device includes a substrate, a pixel electrode, an organic light-emitting layer, an insulating layer, and a counter electrode. The organic EL device may further include a TFT, a planarization film, a hole injection layer, an intermediate layer, and a second insulating layer (line bank).

The material of the substrate differs depending on whether the organic EL device is a bottom emission type or a top emission type. When the organic EL device is a bottom emission type, the substrate needs to be transparent. Therefore, the material of the substrate may be glass, transparent resin, or the like. On the other hand, when the organic EL device is a top emission type, the substrate does not need to be transparent. The material of the substrate is not particularly limited as long as it has an insulating property. The "substrate" means a member having a surface on which a pixel electrode is formed. The substrate includes, for example, a TFT and a planarization film.

In general, the organic EL device is connected to a thin film transistor (a driving TFT) to drive the organic EL device. Specifically, the pixel electrode of the organic EL device is connected to the source or drain electrode of the driving TFT. The organic EL device is stacked on a TFT device.

A planarization film is formed on the TFT. The planarization film planarizes the unevenness of the surface of the TFT and provides a flat surface on which the organic EL device is formed. The planarization film includes a contact hole to connect the pixel electrode of the organic EL device with the source or drain electrode of the driving TFT. The thickness of the planarization film is generally in a range of 3 μm to 10 μm and may be about 5 μm.

Plural pixel electrodes are arranged on the substrate. When the substrate includes a planarization film, the pixel electrodes are formed on the planarization film. When the organic EL device is a bottom emission type, the pixel electrodes need to be a transparent electrode. Examples of the transparent electrode include ITO (Indium Tin Oxide), IZO (Indium Zinc Oxide), and tin oxide. When the organic EL device is a top emission type, the pixel electrodes need to have a light reflecting property. Examples of such pixel electrodes include alloys containing silver such as a silver-palladium-copper alloy (also referred to as APC), a silver-rubidium-gold alloy (also referred to as ARA), a molybdenum-chromium alloy (also referred to as MoCr), a nickel-chromium alloy (also referred to as NiCr), and an aluminum alloy. The thickness of the pixel electrode is generally in a range of 100 nm to 500 nm and probably about 150 nm.

The organic light-emitting layer continuously covers a region including two or more neighboring pixel electrodes. The organic light-emitting layer may directly cover the substrate and the pixel electrodes, or may cover the substrate and the pixel electrodes via another layer interposed therebetween. For example, the organic light-emitting layer may be disposed on another layer which can be a pixel regulating layer formed of an inorganic material such as glass or an intermediate layer formed of an organic material, the another layer covering the surface of the substrate other than the part on which the pixel electrodes are disposed. One or both of a hole injection layer and an intermediate layer may be disposed between the pixel electrode and the organic light-emitting layer. From the viewpoint of simplifying the structure and the manufacturing method of an organic EL device, it is preferable that the organic light-emitting layer be disposed on a region on the substrate including the two or more neighboring pixel electrode.

The hole injection layer is a layer formed of a hole injection material. Examples of the hole injection material include poly(3,4-ethylene dioxythiophene) (also referred to as PEDOT-PSS) doped with polystyrene sulfonate or derivatives (such as copolymers) thereof, metal oxides such as $WO_X$ (tungsten oxide), $MoO_X$ (molybdenum oxide), and $VO_X$ (vanadium oxide) or combinations thereof such as $WO_X$ doped with Mo. The thickness of the hole injection layer is generally in a range of 10 nm to 100 nm and may be about 30 nm. The hole injection layer is generally disposed on the pixel electrodes, but may cover both the substrate and the pixel electrodes.

The intermediate layer serves to suppress the transporting of electrons into the hole injection layer or serves to efficiently transport holes to the organic light-emitting layer. The intermediate layer is a layer formed of, for example, polyaniline-based materials. The thickness of the intermediate layer is generally in a range of 10 nm to 100 nm and is preferably about 30 nm. The intermediate layer may cover only the pixel electrodes or the hole injection layer, or may continuously cover a region on the substrate including the pixel electrodes or the hole injection layer.

The organic light-emitting material contained in the organic light-emitting layer is, for example, a high-molecular light-emitting material. Examples of the high-molecular light-emitting material include polyparaphenylene vinylene and derivatives thereof, polyacetylene and derivatives thereof, polyphenylene and derivatives thereof, polyparaphenylene ethylene and derivatives thereof, poly 3-hexyl thiophene and derivatives thereof, and polyfluorene and derivatives thereof. The organic light-emitting material may be a low-molecular light-emitting material.

The hole injection layer, the intermediate layer, and the organic light-emitting layer formed of organic materials can be disposed in a region defined by line banks to be described later.

The line banks are formed of, for example, polyimide or acryl resin. The resin constituting the line banks may contain fluorine. The resin containing fluorine is not particularly limited as long as it has a fluorine atom in at least some repetition units of a high-molecular repetition unit. Examples of the resin containing fluorine compounds include fluorinated polyolefin resin, fluorinated polyimide resin, and fluorinated polyacryl resin. The height of the line banks from the substrate is generally in a range of 0.1 µm to 3 µm and preferably in a range of 0.8 µm to 1.2 µm.

The shape of each line bank is preferably a forward tapered shape. The forward tapered shape means a shape in which a wall surface of a bank is oblique and the area of the bottom surface of the line bank is larger than the area of the top surface of the line bank. When the shape of the line bank is a tapered shape, the taper angle is generally in a range of 20° to 80° and preferably in a range of 30° to 50°.

The wettability of the top surface of the line bank is preferably low. The top surface of the line bank means a surface including the vertex of the line bank. The wettability of the top surface of the line bank is preferably lower than the wettability of the wall surface of the line bank. The contact angle of the top surface of the line bank with water is preferably larger than or equal to 80° and more preferably larger than or equal to 90°. The contact angle of the top surface of the line bank with anisole, an intermediate ink, or an organic light-emitting ink is preferably in a range of 30° to 70°. On the other hand, the contact angle of the wall surface of the line bank with anisole, an intermediate ink, or an organic light-emitting ink is preferably in a range of 3° to 30°. The larger the contact angle becomes, the lower the wettability becomes.

The insulating layer is disposed on the organic light-emitting layer and covers opposing edges of two or more neighboring pixel electrodes. The part of the organic light-emitting layer located in the central portion of the pixel electrodes is not covered with the insulating layer. The invention is characterized in that the insulating layer covering the edges of the pixel electrodes is located above the organic light-emitting layer (on the counter electrode side) and is not located below the organic light-emitting layer (on the pixel electrode side). The insulating layer may be disposed directly on the organic light-emitting layer or may be disposed on the organic light-emitting layer with another layer such as an electron transport layer interposed therebetween.

The insulating layer is generally disposed along both directions of the long direction and the short direction of the pixel electrodes. When the organic EL device includes a line bank, the line bank is generally formed along the long direction of the pixel electrodes so as to cover the edges of the pixel electrodes. The insulating layer is disposed on the organic light-emitting layer along the direction perpendicular to the line bank. The insulating layer may be disposed on the line bank, but is preferably disposed on only the edges of the pixel electrodes located between the line banks from the viewpoint of further planarizing the counter electrode.

The insulating layer is preferably formed of a cured resin of a delay curing resin composition, which can be cured by ultraviolet rays and heat. When the resin layer disposed on the organic light-emitting layer is irradiated with ultraviolet rays, the organic light-emitting material may deteriorate. From the viewpoint of preventing deterioration of the organic light-emitting layer due to the irradiation of ultraviolet rays, it is preferable that the insulating layer be formed of a cured resin of the delay curing resin composition. Examples of the resin formed through the delay curing of the resin composition include an epoxy resin. The thickness of the insulating layer is preferably in a range of 1 µm to 3 µm.

The counter electrode is disposed on the organic light-emitting layer and the insulating layer. The material of the counter electrode differs depending on whether the organic EL device is a bottom emission type or a top emission type. When the organic EL device is a top emission type, the counter electrode requires a light-transmitting property. Therefore, examples of the material of the counter electrode include ITO and IZO. On the other hand, when the organic EL device is a bottom emission type, the material of the counter electrode is not particularly limited as long as it is a conductor.

The organic EL display panel according to the invention may have a configuration in which the organic EL devices are arranged in a matrix on the same plane. Alternatively, the organic EL device panel according to the invention may have a configuration in which the organic EL devices are arranged on the same plane in rows. The organic EL display panel according to the invention can be manufactured through a manufacturing method to be described later.

In this way, when the organic light-emitting layer is formed in regions defined by the line banks using a coating method, it is possible to prevent the short-circuiting between the counter electrode and the edges of the pixel electrodes, and also to uniformly form the organic light-emitting layer. Therefore, it is possible to suppress occurrence of a difference in brightness or a difference in light emission of the organic display panel and to provide an organic EL display panel with excellent display quality.

2. Method of Manufacturing Organic EL Display Panel According to the Invention A method of manufacturing an organic EL display panel according to the invention includes a step of forming plural pixel electrodes on a substrate, a step of forming an organic light-emitting layer that continuously covers a region including two or more neighboring pixel electrodes, a step of forming an insulating layer on the organic light-emitting layer so as to cover opposing edges of the neighboring pixel electrodes, and a step of forming a counter electrode on the organic light-emitting layer and the insulating layer. The method of manufacturing an organic EL display panel according to the invention may further include other steps as long as the advantages of the invention can be achieved. Examples of the method of manufacturing an organic EL display panel include a method of manufacturing the above-mentioned organic EL device.

The method of manufacturing the organic EL device includes, for example, 1) a first step of forming a TFT on a substrate, 2) a second step of forming a planarization film on the TFT, 3) a third step of forming pixel electrodes on the planarization film, 4) a fourth step of forming a hole injection layer on the pixel electrodes, 5) a fifth step of forming line banks that are disposed to cover a part of the hole injection layer and that defines a line region on the substrate in which the two or more pixel electrodes are arranged in a row, 6) a sixth step of forming an intermediate layer on the hole injection layer in the pixel in line region defined by the line banks, the intermediate layer being formed by applying, drying, and baking an intermediate ink, 7) a seventh step of forming an organic light-emitting layer on the intermediate layer by applying, drying, and baking an organic light-emitting ink, 8) an eighth step of forming an insulating layer on the organic light-emitting layer so as to cover the edges of a stacked layer of the pixel electrodes and the hole injection layer in the direction perpendicular to the line banks, and 9) a ninth step of forming a counter electrode to cover the organic light-emitting layer.

In the first step of 1), the TFT is formed on the substrate. The TFT may be a silicon-based TFT or an organic TFT.

In the second step of 2), the planarization film is formed on the TFT. The planarization film is formed of, for example, a photosensitive resin through a photolithography. A contact hole for connecting the electrode of the TFT with the pixel electrode is formed in the planarization film.

In the third step of 3), the pixel electrodes are formed on the planarization film. The pixel electrodes can be formed, for example, by forming a thin conductor film through a sputtering method or the like and patterning the thin conductor film through etching. The method of forming the pixel electrodes is not particularly limited.

In the fourth step of 4), the hole injection layer is formed on the pixel electrodes. Examples of the material of the hole injection layer include oxides of transition metals, PEDOT, and other materials capable of forming a coating film through a coating method. The hole injection layer is formed on the pixel electrodes, for example, from tungsten oxide through a sputtering method.

In the fifth step of 5), the line banks defining a line region in which two or more pixel areas are arranged in a row are formed so as to cover a part of the hole injection layer. The material of the line banks is a resin synthesized from a photosensitive material such as polyimide or acryl resin. The resin may contain fluorine. The banks are formed through photolithography processes (applying, baking, exposing, developing, and burning). The line banks are generally formed to cover the edges of the pixel electrodes along the long direction of the pixel electrodes with the hole injection layer interposed therebetween.

In the sixth step of 6), an intermediate ink including an intermediate material and a solvent is applied onto the hole injection layer. The solvent is determined depending on the type of the intermediate material. Examples of the solvent include an aromatic solvent such as anisole. The application method is not particularly limited. Examples of the application method include an inkjet method, a dispensing method, a nozzle coating method, a spin coating method, a die coating method, an intaglio printing method, and an anastatic printing method. The inkjet method is preferable. The intermediate layer is formed by drying and backing the applied film.

In the seventh step of 7), an organic light-emitting ink including an organic light-emitting material and a solvent is applied to line region defined by the line banks. The applied organic light-emitting ink includes a desired light-emitting material and a solvent. The solvent is determined depending on the type of the light-emitting material. Examples of the solvent include an aromatic solvent such as anisole. The application method is not particularly limited. Examples of the application method include an inkjet method, a dispensing method, a nozzle coating method, a spin coating method, a die coating method, an intaglio printing method, and an anastatic printing method. The inkjet method is preferable. The organic light-emitting layer continuously covering a region on the substrate including the tow or more neighboring pixel electrodes is formed by drying and backing the applied film.

In the eighth step of 8), the insulating layer covering the edges of the pixel electrodes is formed on the organic light-emitting layer in the direction perpendicular to the long direction of the pixel electrodes. The insulating layer is formed by applying an insulating material through a screen printing method, a dispensing method, a die coating method, or the like. When there is no line bank, or when the line banks are separated from the edges of the pixel electrodes such that the edges of the pixel electrodes are not covered with the line banks, an insulating layer covering the edges of the pixel electrodes is further formed along the long direction of the pixel electrodes.

When the insulating layer is formed of the cured resin of a delay curing resin composition, the insulating material containing the delay curing resin composition is irradiated with ultraviolet rays before applying the insulating material onto the organic light-emitting layer. The insulating material to which ultraviolet rays are applied is applied onto the organic light-emitting layer so as to cover the edges of the pixel electrodes. The insulating layer is formed by curing the applied insulating material through heat treatment. Examples of the delay curing resin composition include an epoxy resin described in Japanese Patent Application Laid-Open No. 2011-38090, aliphatic compounds having an epoxy group and a hydroxyl group, and compositions containing a cation polymerization initiator.

In the ninth step of 9), the counter electrode is formed so as to cover the organic light-emitting layer and the insulating layer. The counter electrode is formed of a transparent conductive material such as ITO through a sputtering method.

The method of manufacturing an organic EL device is not limited to the above-mentioned method. For example, in the above-mentioned manufacturing method, the pixel electrodes may be formed on the substrate without forming the planarization film. In this case, the second step may be omitted. In the above-mentioned manufacturing method, the organic light-emitting layer may be formed on the pixel electrodes and the substrate without forming the intermediate layer. In this case, the sixth step may be omitted. Alternatively, the above-mentioned manufacturing method may further include a step of removing the intermediate layer between the pixel electrodes on the substrate. In this case, a step of removing the applied film of the intermediate ink from the substrate may be included between the sixth step and the seventh step. In the above-mentioned manufacturing method, a pixel regulating layer can be disposed on a region on the substrate other than a region between the pixel electrodes. In this case, a step of forming a pixel regulating layer may be included between the third step and the fourth step.

Hereinafter, embodiments of the invention will be described with reference to the accompanying drawings.

Embodiment 1

In Embodiment 1, a top emission type organic EL device will be described.

Figure 1A:
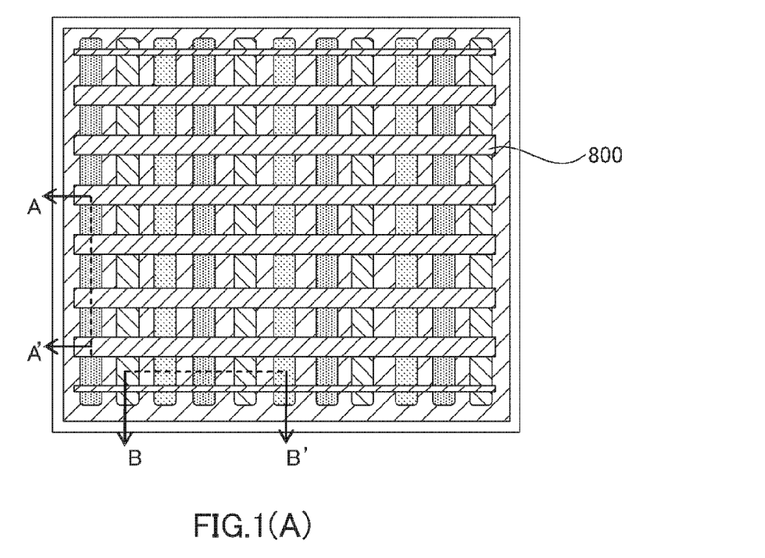
FIG. 1(A) is a plan view.
Figure 1B:
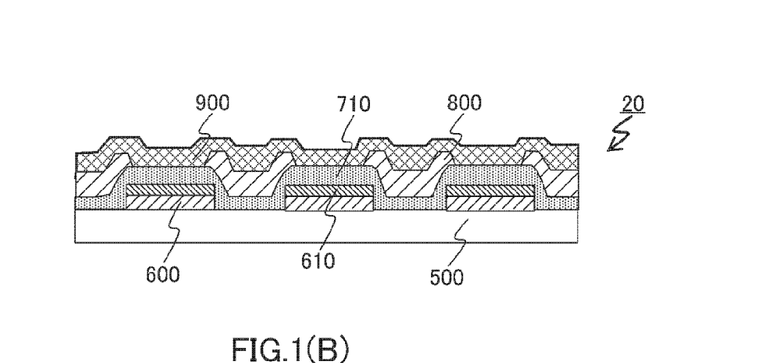
FIG. 1(B) is a cross-sectional view taken along line A-A'.
Figure 1C:
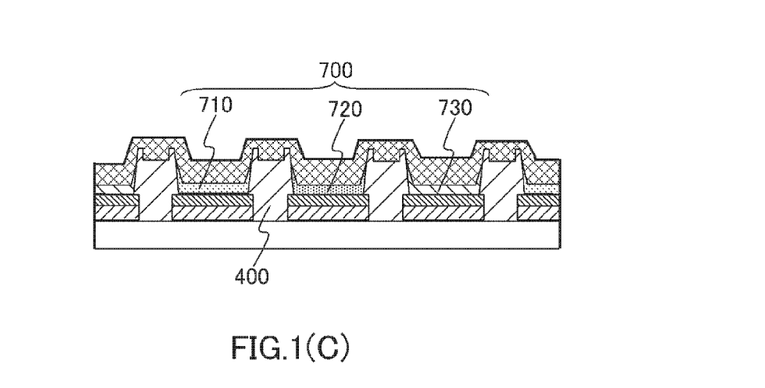
FIG. 1(C) is a cross-sectional view taken along line B-B'.

FIG. 1(A) is a plan view illustrating organic EL device 20 according to Embodiment 1 of the invention. FIG. 1(B) is a cross-sectional view of the organic EL device taken along line A-A' of FIG. 1(A). FIG. 1(C) is a cross-sectional view of the organic EL device taken along line B-B' of FIG. 1(A). In FIG. 1(A), FIG. 2(A), FIG. 3(A), and FIG. 4(A), transparent negative electrode 900 is not shown.

As shown in FIGS. 1(B) and (C), the organic EL device 20 includes substrate 500, pixel electrodes 600, hole injection layer 610, organic light-emitting layer 700, insulating layer 800, line banks 400, and transparent negative electrode 900. Substrate 500 is, for example, a glass substrate.

Pixel electrodes 600 are a conductive layer disposed on substrate 500. Pixel electrodes 600 are formed of, for example, an APC alloy. The thickness of pixel electrodes 600 is preferably in a range of 100 nm to 200 nm.

Hole injection layer 610 is disposed on pixel electrodes 600. Hole injection layer 610 is formed of tungsten oxide ($WO_x$). The thickness of hole injection layer 610 is preferably in a range of 5 to 30 nm.

Line banks 400 define areas of organic light-emitting layer 700. Specifically, the line banks are formed so as to define a line region in which two or more pixel electrodes 600 are arranged in a row. The line banks are disposed to cover at least a part of hole injection layer 610. For example, line banks 400 are disposed to cover the edges of pixel electrodes 600 along the long direction with hole injection layer 610 interposed therebetween. Line banks 400 are formed of, for example, fluorinated acryl resin. The height of line banks 400 from hole injection layer 610 on the substrate is preferably in a range of 0.1 μm to 3 μm. Line banks 400 are formed to expose hole injection layer 610.

Organic light-emitting layer 700 is disposed on hole injection layer 610. Organic light-emitting layer 700 is a layer covering hole injection layer 610 and a part of substrate 500, the part being located between pixel electrodes 600. The edges of pixel electrodes 600 are covered with organic light-emitting layer 700 with hole injection layer 610 interposed therebetween (for example, see reference numeral 710 in FIG. 1(B)). The thickness of organic light-emitting layer 700 is preferably in a range of 50 nm to 150 nm. Organic light-emitting layer 700 is a layer formed of a derivative of polyfluorene.

Insulating layer 800 is formed on organic light-emitting layer 700 in a direction perpendicular to line direction of line banks 400. Insulating layer 800 is formed to cover the edges of pixel electrodes 600 with organic light-emitting layer 700 and hole injection layer 610 interposed therebetween. The thickness of organic light-emitting layer 700 formed on pixel electrodes 600 and hole injection layer 610 may decrease at the edges of the layers. As a result, pixel electrodes 600 and transparent negative electrode 900 may short-circuit. Since insulating layer 800 is arranged on organic light-emitting layer 700, such short-circuit is suppressed. The thickness of insulating layer 800 is preferably in a range of 0.5 μm to 3 μm. Insulating layer 800 is arranged on the substrate between the two neighboring pixel electrodes 600 so as to cover opposing edges of the neighboring pixel electrodes 600. The two neighboring pixel electrodes 600 are arranged in a row along the line direction of line banks 400.

Transparent negative electrode 900 is a light-transmitting conductive layer disposed on organic light-emitting layer 700 and insulating layer 800. The material of transparent negative electrode 900 is, for example, ITO.

When a voltage is applied between pixel electrodes 600 and transparent negative electrode 900, holes from pixel electrodes 600 and electrons from transparent negative electrode 900 are injected into organic light-emitting layer 700. The injected holes and electrons are combined inside organic light-emitting layer 700 to generate excitons. Organic light-emitting layer 700 generates light due to the excitons and emits light through transparent negative electrode 900.

A method of manufacturing organic EL device 20 will be described below. The method of manufacturing organic EL device 20 includes 1) a first step of forming pixel electrodes 600 and hole injection layer 610 on substrate 500, 2) a second step of forming line banks 400 covering at least a part of hole injection layer 610 and defining a line region in which the two or more pixel electrodes 600 are arranged in row, 3) a third step of forming organic light-emitting layer 700 on hole injection layer 610, 4) a fourth step of forming insulating layer 800 on organic light-emitting layer 700 in the direction perpendicular to line banks 400, and 5) a fifth step of forming transparent negative electrode 900.

The first step of 1) includes a forming a film made of material of pixel electrodes 600 on substrate 500 through a deposition method, a sputtering method or the like, and an etching a film so as to form a pattern of pixel electrodes 600. Hole injection layer 610 is formed on pixel electrodes 600. The manufacturing method thereof is the same as forming pixel electrodes 600. The hole injection layer is formed through a forming a film by sputtering method or the like, and etching the film so as to form a pattern.

In the second step of 2), line banks 400 are formed on hole injection layer 610 so as to expose a part thereof. Line banks 400 are formed, for example, through a photolithography method. Specifically, the photolithography method includes a material applying process, a pre-baking process, an exposing process, a developing process, and post-baking process. Although not particularly limited, for example, the pre-baking process is performed at 100° C. for 2 minutes. The exposing process is performed using i-rays having a main peak at 365 nm with a dose of 200 mJ/cm$^2$. The developing process is performed by removing by 0.2% TMAH for 60 seconds and washing with pure water for 60 seconds. The post-backing process is performed in a clean oven at 220° for 60 minutes.

In the third step of 3), organic light-emitting layer 700 is formed on hole injection layer 610, for example, through an inkjet method. An organic light-emitting ink is applied to the entire range of the pixel areas disposed in the line region defined by line banks 400 through an inkjet method, and then the resultant film of the ink is dried and baked. The drying is performed, for example in a vacuum chamber inside of which is depressurized. The depressurization can be performed with a vacuum pump until an ultimate pressure of 5 Pa. The temperature is at 25° C. The baking process is performed, for example, using a hot plate at 130° C. for 10 minutes.

In the fourth step of 4), insulating layer 800 is formed, for example, using a screen printing method. Insulating layer 800 is formed in a thickness of 1 μm so as to cover the edges of pixel electrodes 600 and hole injection layer 610 and to be arranged perpendicular to line direction of line banks 400. Insulating layer 800 is extended on line banks 400. The material thereof employs a delay curing type photosensitive resin composition. When the material is irradiated with ultraviolet rays after being applied, organic light-emitting layer 700 may deteriorate. Accordingly, the material irradiated with ultraviolet rays in advance is applied using a screen printing method to form insulating layer 800. The ultraviolet rays for the irradiation has a wavelength of 365 nm with a dose of 1 J/cm$^2$, for example. The film is heated at 80° C. for 1 hour so as to be cured.

In the fifth step of 5), transparent negative electrode 900 is formed, for example, on organic light-emitting layer 700 and insulating layer 800 through a deposition method.

In this embodiment, when organic light-emitting layer 700 is formed in the line region defined by line banks 400 through application, is possible to suppress the short-circuiting between pixel electrodes 600 and transparent negative electrode 900 at the edges of pixel electrodes 600. It is also possible to uniformly form organic light-emitting layer 700.

By line banks 400, organic light-emitting layers of three colors of red (red organic light-emitting layer 710), green (green organic light-emitting layer 720), and blue (blue organic light-emitting layer 730) can be printed separately. Therefore, it is possible to provide a full-color organic EL display panel. By arranging color filters of three colors of red, green, and blue on white organic EL devices instead of printing three color light-emitting layers, it may be possible to provide a full-color organic EL display panel. In this case, the lifetime of the organic EL device may be shortened, because it may be necessary to raise the driving voltage for compensating a reduction of brightness due to the color filters.

Embodiment 2

Figure 2A:
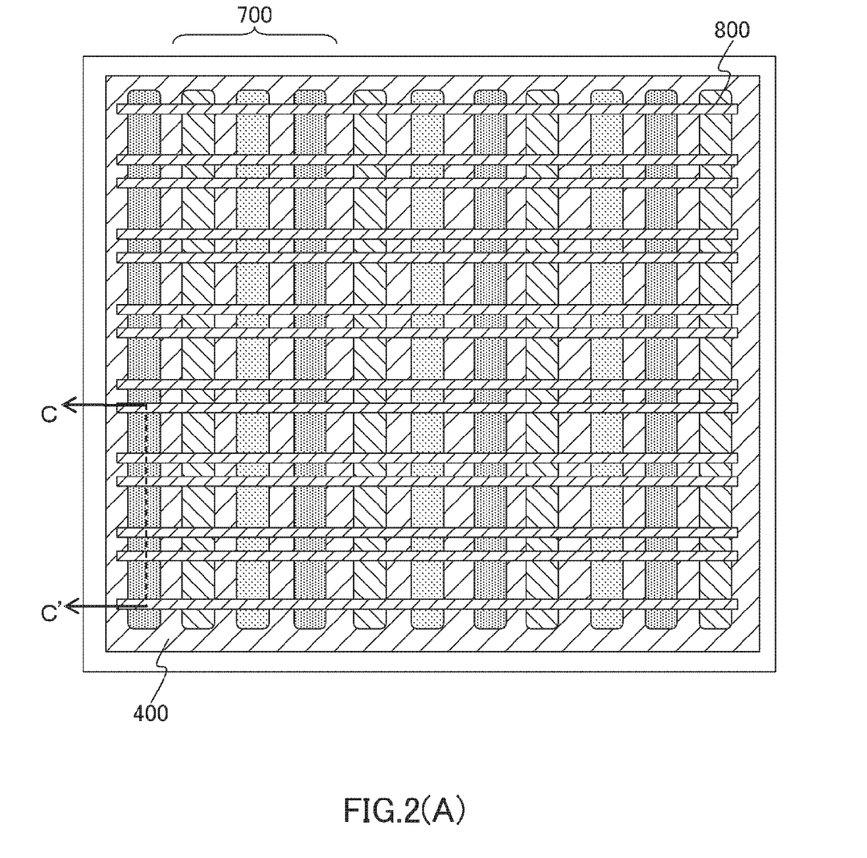
FIG. 2(A) is a plan view and FIG. 2(B) is a cross-sectional view taken along line C-C'.
Figure 2B:
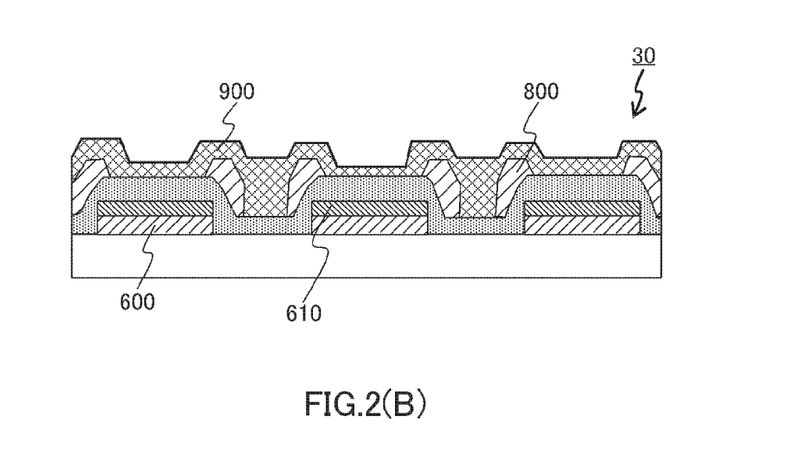

FIG. 2(A) is a plan view illustrating organic EL device 30 according to Embodiment 2. FIG. 2(B) is a cross-sectional view of the organic EL device taken along line C-C' of FIG. 2(A).

Insulating layer 800 is formed to independently cover the edges in the short direction of the pixel electrodes, instead of covering neighboring pixel electrodes 600 along line direction of line banks 400. The other configurations are the same as in Embodiment 1.

In this embodiment, when organic light-emitting layer 700 is formed in the line region defined by line banks 400 by application, it is possible to suppress the short-circuiting between pixel electrodes 600 and transparent negative electrode 900 at the edges of pixel electrodes 600. It is also possible to uniformly form organic light-emitting layer 700.

In this embodiment, the volume of insulating layer 800 formed on organic light-emitting layer 700 can be reduced. Accordingly, it is possible to further reduce the amount of out gas from insulating layer 800, and thus to further suppress the deterioration of organic light-emitting layer 700.

Embodiment 3

Figure 3:
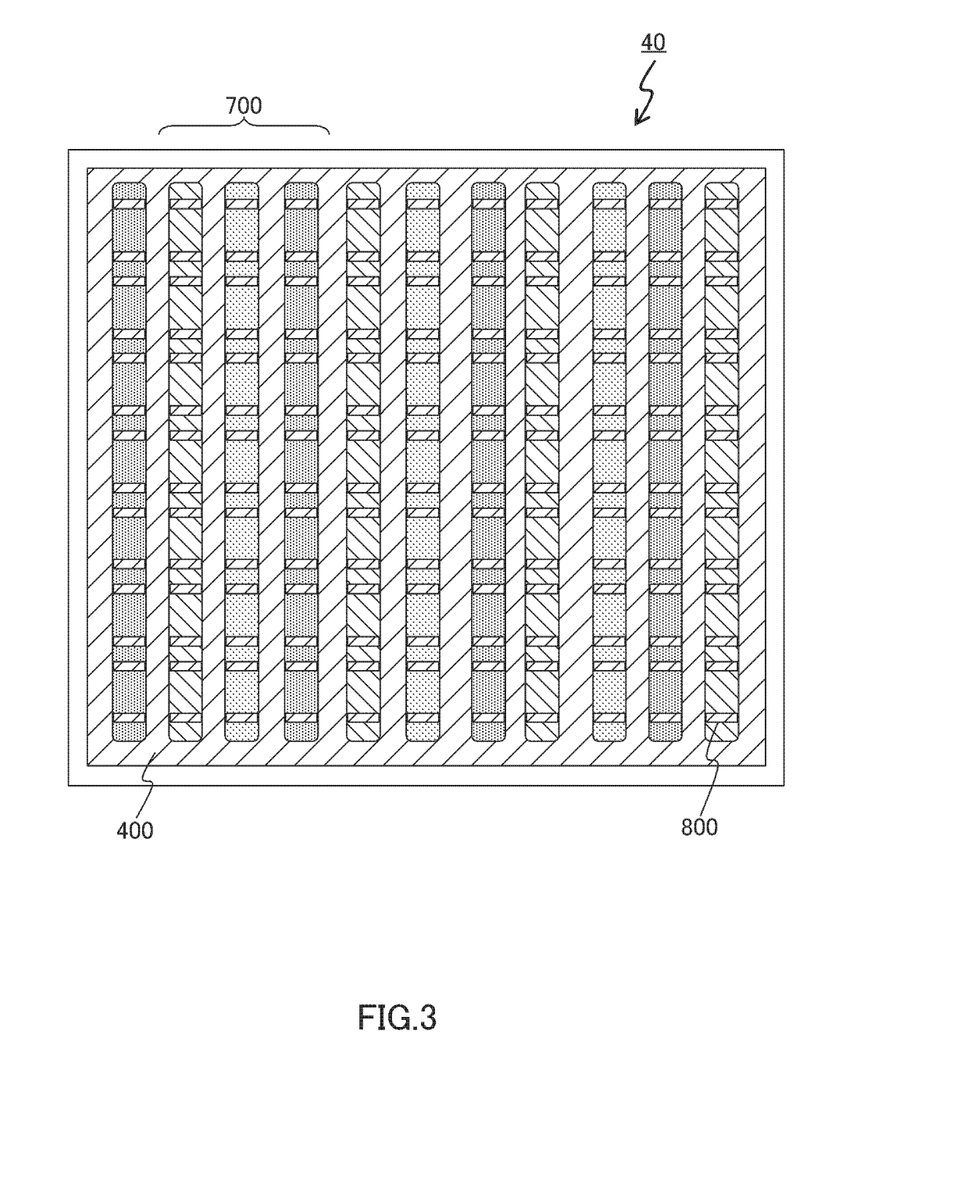
FIG. 3 is a plan view illustrating an organic EL device according to Embodiment 3.

FIG. 3 is a plan view of organic EL device 40 according to Embodiment 3. Insulating layer 800 is not formed on line banks 400. By applying an insulating material onto only a part of the pixel area arranged in the line region defined by line banks 400, insulating layer 800 is formed to cover the edges of the pixel electrodes and the hole injection layer. The other configurations are the same as in Embodiment 2.

In this embodiment, when organic light-emitting layer 700 is formed in the line region defined by line banks 400 by application, it is possible to suppress the short-circuit between the pixel electrodes and the transparent negative electrode at the edges of the pixel electrodes. It is also possible to uniformly form organic light-emitting layer 700. Since insulating layer 800 is not formed on the top surface of line banks 400, the unevenness of the top surface of the organic EL device is reduced. The light emission characteristics of the organic EL device deteriorate due to oxygen or water in the environments. Accordingly, it is general that a sealing layer made of resin or thin film is formed. The sealing layer requires coatability. When the unevenness of a coating target is large, it is apparent that the coatability thereof becomes worse. Therefore, in the organic EL device according to Embodiment 3 in which the unevenness of the device can be reduced, the coatability of the sealing layer is improved. Accordingly, it is possible to provide an organic EL device with smaller deterioration of the light emission characteristics.

Embodiment 4

Figure 4A:
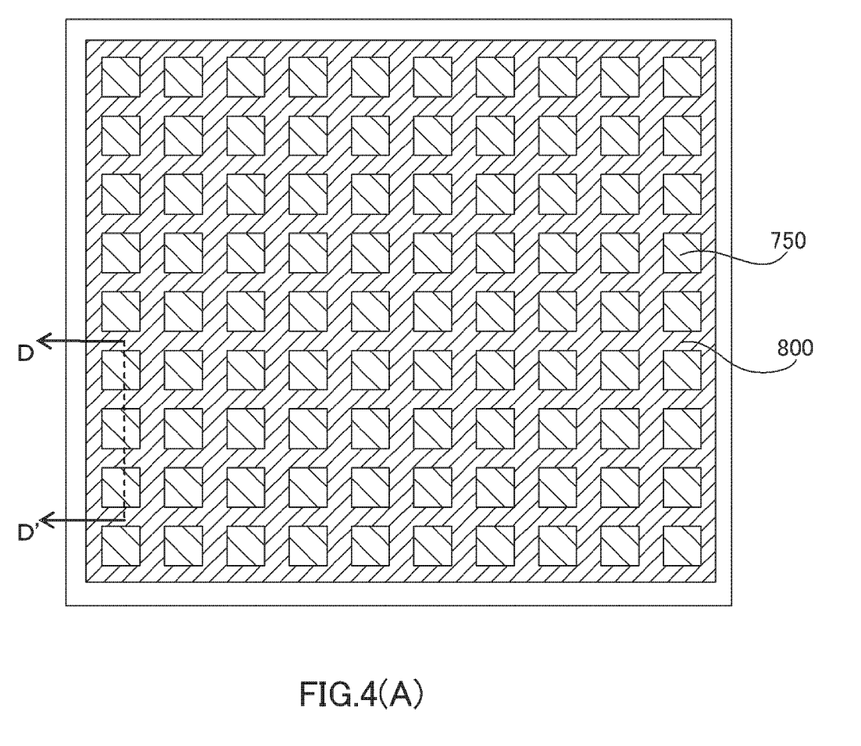
FIG. 4(A) is a plan view and FIG. 4(B) is a cross-sectional view taken along line D-D'.
Figure 4B:
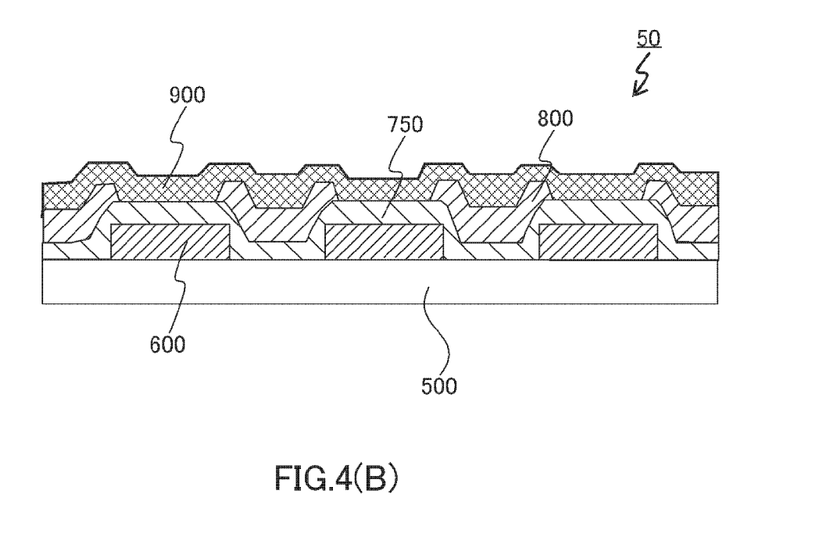

FIG. 4(A) is a plan view illustrating organic EL device 50 according to Embodiment 4. FIG. 4(B) is a cross-sectional view of the organic EL device taken along line D-D' of FIG. 4(A). In Embodiment 4, banks are not formed. White organic light-emitting layer 750 covers pixel electrodes 600 which are formed on the entire surface of substrate 500 by a spin coating method or a slit coating method. Insulating layer 800 is formed in a well-curb shape on white organic light-emitting layer 750 so as to cover the edges of pixel electrodes 600 with white organic light-emitting layer 750 interposed therebetween. Transparent negative electrode 900 is formed to cover white organic light-emitting layer 750 and insulating film 800. In this way, a white organic EL device is provided.

With this configuration, it is possible to suppress the short-circuit between the pixel electrodes and the counter electrode due to a decrease in thickness of the organic light-emitting layer at the edges of the pixel electrodes. Accordingly, it is possible to provide an organic EL device with excellent light emission characteristics.

EXAMPLES

In an example, it will be described by experimental data that the shape of the organic light-emitting layer is depended on the cases where only a reflection electrode is disposed on the surface to which the organic light-emitting layer is applied and where a reflection electrode and an insulating layer are disposed thereon.

Example

A silver-palladium-copper (APC) film with a thickness of 150 nm was formed as a pixel electrode using a sputtering method on a glass substrate AN100 (370 mm×470 mm×0.7 mm) made by Asahi Glass Co., Ltd.

Line banks were formed on the glass substrate having the APC film using a photolithography method. An acryl resin material made by Asahi Glass Co., Ltd. was used as the material of the line banks. A film of the acryl resin material was formed using a spin coating method and a pre-baking process was performed at a temperature of 100° C. for 2 minutes. Then, the resultant was irradiated with ultraviolet rays via a photo mask. The used bank material was a negative type material, in which an exposed portion was cured through a cross-linking reaction. The wavelength of the ultraviolet rays was a broad band having a main peak at 365 nm. The exposing dose was 20 mW/cm$^2$ and the exposure time was 10 seconds. Then, the resultant was developed using a 0.2% TMAH aqueous solution (NMD-3 made by Tokyo Ohka Kogyo Co., Ltd.). The developer was washed with pure water, and then a post-backing process was performed in a clean oven at 220° C. for 60 minutes.

An organic light-emitting ink including an organic light-emitting material was printed in the regions defined by the line banks by an inkjet method. A solvent of the organic light-emitting ink was cyclohexylbenzene. The printed ink was dried by depressurization drying. The depressurization drying was performed in a vacuum chamber equipped with a vacuum pump. The evacuation speed was set to a speed at which the chamber was evacuated from the atmospheric pressure to 10 Pa for 30 seconds. The drying temperature was set to 25° C. Thereafter, the resultant was backed using a hot plate at 130° C. for 10 minutes.

Figure 6A:
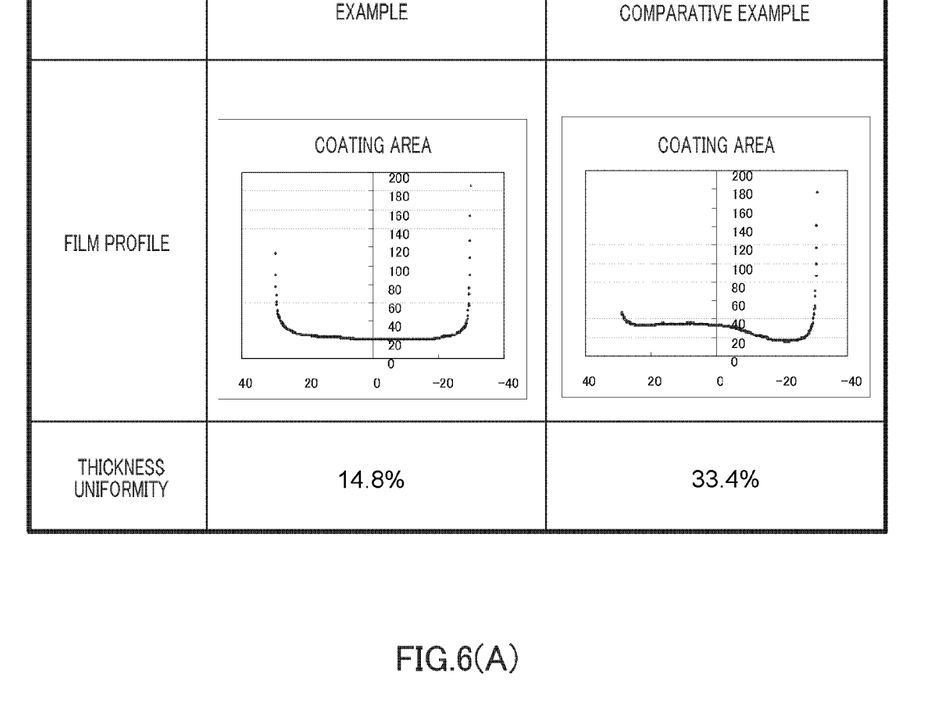
FIG. 6 is a diagram illustrating the relationship between a film profile and thickness uniformity in a short direction of a pixel electrode.
Figure 6B:
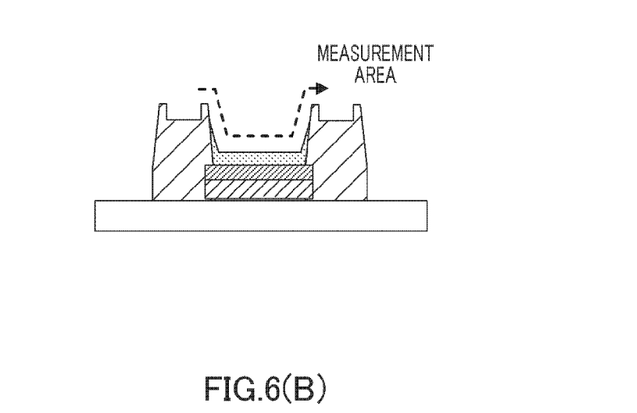
Figure 7A:
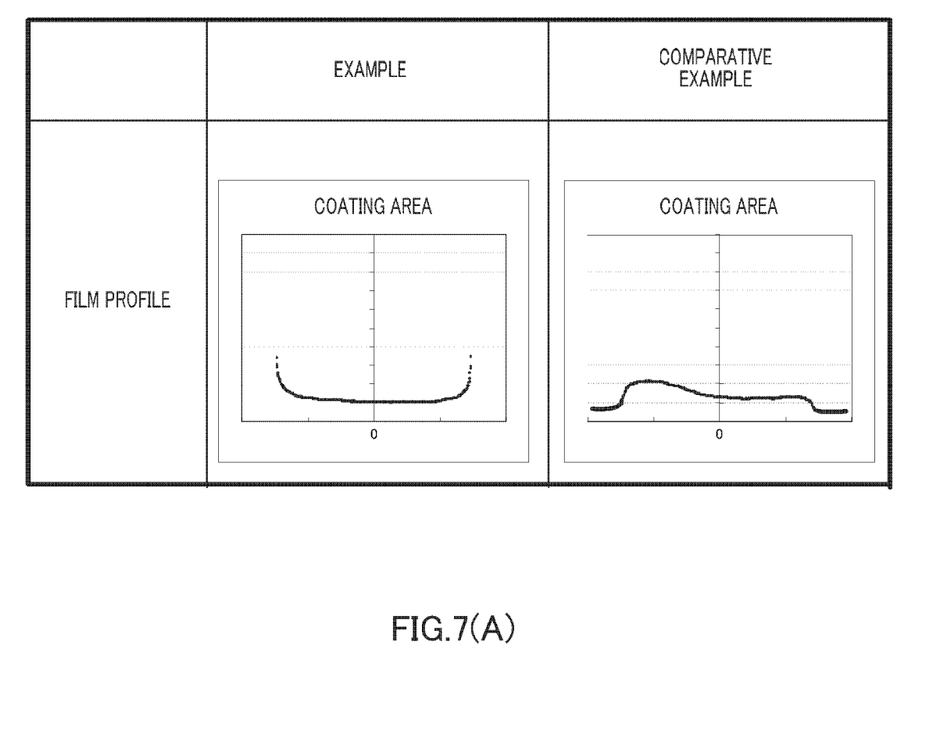
FIG. 7 is a diagram illustrating a film profile in a long direction of a pixel electrode.
Figure 7B:
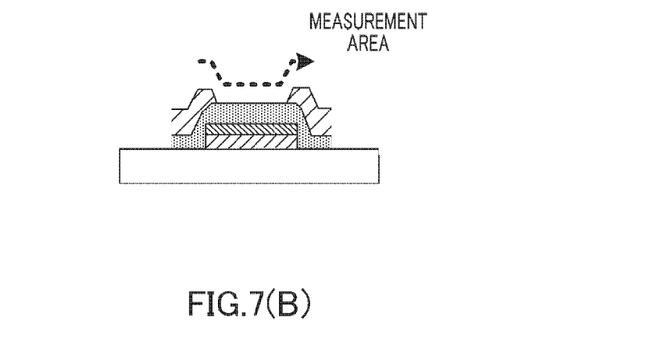

The film shape of the organic light-emitting layer manufactured was measured by an atomic force microscope (AS-7B made by Takano Co., Ltd.). The film profile and the thickness uniformity along the short direction (direction parallel to line B-B' in FIG. 1(A)) of the pixel electrode are shown in of FIG. 6(A). The measurement area was set to an area between two line banks in parallel (FIG. 6(B)). The film profile in the long direction (direction parallel to line A-A' in FIG. 1(A)) of the pixel electrodes is shown in FIG. 7(A). The measurement area was set to an area between two insulating layers in parallel (FIG. 7(B)).

Comparative Example

A silver-palladium-copper (APC) film with a thickness of 150 nm was formed as a pixel electrode using a sputtering method on a glass substrate AN100 (370 mm×470 mm×0.7 mm) made by Asahi Glass Co., Ltd.

An insulating layer was formed to cover the edges of the formed APC film. The insulating layer was a silicon oxide ($SiO_2$) film with a thickness of 100 nm formed using a sputtering method. Line banks were formed thereon using a photolithography method. The formation conditions of the line banks were the same as in the example.

Next, organic light-emitting layers were formed in line regions defined by the line banks, and shape of the layers were evaluated. The formation conditions and the evaluation method of the organic light-emitting layer were the same as in the example.

Evaluation of Example and Comparative Example

The thickness uniformity which is an indicator of the film profile and the film shape of the organic light-emitting layer in the example and the comparative example is shown in FIG. 6. The thickness uniformity is a value expressed by Expression 1.

Thickness Uniformity(%)={(maximum thickness− minimum thickness)/(2×average thickness)}×100 (Expression 1)

It could be seen that the film profile was further distorted in the comparative example rather than in the example. The thickness uniformity in the short direction of the pixel electrodes was 14.8% in the example and was 33.4% in the comparative example. The underlayer on which the organic light-emitting layer was printed includes the glass and the APC film in the example; and includes the glass, the APC film and the $SiO_2$ film in the comparative example. The number of types of the materials which are arranged on the underlayer was more in the comparative example than in the example. Since the wettability differs depending on the materials, the larger number of types of the materials is present on the underlayer, the larger application unevenness occurs.

It can be seen from the above description that as the number of types of the materials on the underlayer becomes smaller, the organic light-emitting layer with a more uniform thickness can be formed. In the organic EL display panel, when the thickness of the organic light-emitting layer is non-uniform, a difference in brightness or a difference in light emission occurs, and thus the display quality deteriorates. Therefore, in the organic EL display panel according to the invention, the thickness of the organic light-emitting layer is uniform and thus the display quality is superior.

The present application is entitled to the benefit of Japanese Patent Application No. 2011-095748 filed Apr. 22, 2011, the disclosure of which is hereby incorporated by referenced in its entirely.

The organic EL display panel of the invention can prevent a short-circuit between an edge of a pixel electrode and a counter electrode and can achieve a uniform in brightness, even when an organic EL layer of the organic EL display panel is formed in a line region defined by line banks by application method. Therefore, the present invention can provide an organic EL display panel with high display quality at low production cost. The organic EL display panel can be applied to a display of various electric devices such as portable information processing device including a word processor and PC, and wristwatch type electric devices.

REFERENCE SIGNS LIST 10, 20, 30, 40, 50 Organic EL device
100, 500 Substrate
210, 600 Pixel electrode
220, 800 Insulating layer
230, 400 Line bank
240 Second bank
300 Pixel area
610 Hole injection layer
700 Organic light-emitting layer
710 Red organic light-emitting layer
720 Green organic light-emitting layer
730 Blue organic light-emitting layer
750 White organic light-emitting layer
900 Transparent negative electrode

The invention claimed is:

1. An organic EL display panel comprising:
a plurality of pixel electrodes that are arranged on a substrate;
an organic light-emitting layer that is continuously disposed over a region including two or more neighboring pixel electrodes;
an insulating layer that is disposed on the organic light-emitting layer, covers opposing edges of the neighboring pixel electrodes, but does not cover a part of the organic light-emitting layer located in a central portion of each of the neighboring pixel electrodes;
a counter electrode that is disposed on the organic light-emitting layer and the insulating layer, and
a thin film transistor that has a source electrode and a drain electrode, and one of the plurality of pixel electrodes is connected to the source electrode or the drain electrode.

2. The organic EL display panel according to claim 1, wherein the organic light-emitting layer covers the two or more neighboring pixel electrodes and a region on the substrate between the neighboring pixel electrodes.

3. The organic EL display panel according to claim 1, further comprising a second insulating layer that defines a line region on the substrate in which the plurality of pixel electrodes are arranged in a row.

4. The organic EL display panel according to claim 3, wherein the insulating layer is not disposed on the top surface of the second insulating layer.

5. The organic EL display panel according to claim 1, wherein the insulating layer is formed of a cured resin of a delay curing resin composition, which is curable in a predetermined time after ultraviolet rays are applied.

6. A method of manufacturing an organic EL display panel, comprising:
a step of forming a plurality of pixel electrodes on a substrate, wherein each of the plurality of pixel electrodes is connected to a thin film transistor that has a source electrode and a drain electrode, and one of the pixel electrodes is connected to the source electrode or the drain electrode;
a step of forming an organic light-emitting layer so as to continuously cover a region including two or more neighboring pixel electrodes;
a step of forming an insulating layer on the organic light-emitting layer so as to cover opposing edges of the neighboring pixel electrodes but not cover a cart of the organic light-emitting layer located in a central portion of the neighboring pixel electrodes; and a step of forming a counter electrode on the organic light-emitting layer and the insulating layer.

7. The method of manufacturing an organic EL display panel according to claim 6,
wherein the step of forming the organic light-emitting layer is a step of forming an organic light-emitting layer so as to cover the two or more neighboring pixel electrodes and a region on the substrate between the neighboring pixel electrodes.

8. The method of manufacturing an organic EL display panel according to claim 6, further comprising a step of forming a second insulating layer that defines a line region on the substrate in which the plurality of pixel electrodes are arranged in a row,
wherein the organic light-emitting layer is formed on a region on the substrate including the two or more neighboring pixel electrodes in the line region defined by the second insulating layer.

9. The method of manufacturing an organic EL display panel according to claim 6, wherein the step of forming the insulating layer includes:
irradiating an insulating material containing a delay curing resin composition with ultraviolet rays;
applying the insulating material irradiated with the ultraviolet rays on the organic light-emitting layer so as to cover the opposing edges of the neighboring pixel electrodes; and
curing the applied insulating material through heat treatment.

10. A method of manufacturing an organic EL display panel, comprising:
a step of forming a plurality of pixel electrodes on a substrate, wherein each of the plurality of pixel electrodes is connected to a thin film transistor;
a step of forming an organic light-emitting layer so as to cover a region including two or more neighboring pixel electrodes;
a step of forming an insulating layer on the organic light-emitting layer so as to cover opposing edges of the neighboring pixel electrodes; and
a step of forming a counter electrode on the organic light-emitting layer and the insulating layer, wherein the step of forming the insulating layer includes:
irradiating an insulating material containing a delay curing resin composition with ultraviolet rays;
applying the insulating material irradiated with the ultraviolet rays on the organic light-emitting layer so as to cover the opposing edges of the neighboring pixel electrodes; and
curing the applied insulating material through heat treatment.

\* \* \* \* \*